(12) United States Patent
Motomura (10) Patent No.: US 12,013,429 B2
(45) Date of Patent: Jun. 18, 2024

(54) TRANSPORT SYSTEM, INSPECTION SYSTEM, AND INSPECTION METHOD

(71) Applicant: Tokyo Electron Limited, Tokyo (JP)

(72) Inventor: Seiichiro Motomura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 180 days.

(21) Appl. No.: 17/595,461

(22) PCT Filed: May 15, 2020

(86) PCT No.: PCT/JP2020/019449
§ 371 (c)(1),
(2) Date: Nov. 17, 2021

(87) PCT Pub. No.: WO2020/241306
PCT Pub. Date: Dec. 3, 2020

(65) Prior Publication Data
US 2022/0206058 A1 Jun. 30, 2022

(30) Foreign Application Priority Data

May 28, 2019 (JP) ................................ 2019-099727

(51) Int. Cl.
| | |
|---|---|
| *H01L 21/67* | (2006.01) |
| *G01R 1/073* | (2006.01) |
| *G01R 31/26* | (2020.01) |
| *G01S 19/13* | (2010.01) |
| *H01L 21/677* | (2006.01) |

(52) U.S. Cl.
CPC ...... *G01R 31/2642* (2013.01); *G01R 1/07342* (2013.01); *G01S 19/13* (2013.01); *H01L 21/67259* (2013.01); *H01L 21/67724* (2013.01); *H01L 21/6773* (2013.01)

(58) Field of Classification Search
CPC ............ G01R 31/2642; G01R 1/07342; H01L 21/67259; H01L 21/67724; H01L 21/6773
USPC ............................... 324/750.3, 756.01–756.3
See application file for complete search history.

(56) References Cited

U.S. PATENT DOCUMENTS

| | | | | |
|---|---|---|---|---|
| 5,444,386 A | * | 8/1995 | Mizumura | G01R 1/07314 |
| | | | | 324/756.04 |
| 5,619,145 A | * | 4/1997 | Matsuda | G01R 31/2806 |
| | | | | 324/750.25 |
| 7,153,087 B2 | * | 12/2006 | Kang | H01L 21/68 |
| | | | | 414/781 |
| 7,609,053 B2 | * | 10/2009 | Hsu | G01R 31/01 |
| | | | | 324/759.02 |

(Continued)

FOREIGN PATENT DOCUMENTS

| | | | | |
|---|---|---|---|---|
| CN | 101611324 B | * | 11/2012 | ........... B23K 26/032 |
| JP | H10-284548 | | 10/1998 | |

(Continued)

*Primary Examiner* — Alesa Allgood
(74) *Attorney, Agent, or Firm* — IPUSA, PLLC (57) ABSTRACT

According to one aspect of the present disclosure, a transport system includes a mobile cassette unit capable of storing a plurality of structures and supplying the structures to an inspection unit, wherein each of the structures includes a substrate on which a plurality of devices are formed, and an interconnect member including a contact section that electrically contacts an electrode of the plurality of devices.

7 Claims, 5 Drawing Sheets

(56) References Cited

U.S. PATENT DOCUMENTS

| | | | | |
|---|---|---|---|---|
| 8,294,480 | B2* | 10/2012 | Suzuki | G01R 31/2887 324/750.16 |
| 8,872,532 | B2* | 10/2014 | Breinlinger | G01R 1/0491 324/750.19 |
| 9,581,641 | B2* | 2/2017 | Yamada | G01R 31/2891 |
| 9,638,719 | B2* | 5/2017 | Shinohara | G01R 1/07342 |
| 9,759,762 | B2* | 9/2017 | Shinohara | G01R 31/2887 |
| 10,352,966 | B2* | 7/2019 | Liu | G01R 31/2889 |
| 11,099,234 | B2* | 8/2021 | Wang | G01R 31/2889 |
| 2003/0160401 | A1* | 8/2003 | Kang | H01L 21/68735 700/60 |
| 2008/0231301 | A1* | 9/2008 | Suzuki | G01R 31/2887 324/756.03 |
| 2009/0237098 | A1* | 9/2009 | Hsu | G01R 31/01 324/757.03 |
| 2010/0111650 | A1* | 5/2010 | Quach | H01L 21/67751 414/221 |
| 2011/0037492 | A1* | 2/2011 | Seubert | G01R 1/0491 324/762.01 |
| 2011/0156735 | A1* | 6/2011 | Breinlinger | G01R 1/0491 324/750.19 |
| 2016/0054357 | A1* | 2/2016 | Shinohara | G01R 3/00 324/758.01 |
| 2016/0054375 | A1* | 2/2016 | Yamada | G01R 31/2891 324/750.2 |
| 2016/0133502 | A1* | 5/2016 | Won | B25J 9/1679 901/46 |
| 2017/0276701 | A1* | 9/2017 | Liu | G01R 1/07364 |
| 2020/0088788 | A1* | 3/2020 | Wang | G01R 31/2893 |
| 2022/0206058 | A1* | 6/2022 | Motomura | H01L 21/6773 |

FOREIGN PATENT DOCUMENTS

| | | | | |
|---|---|---|---|---|
| JP | 2009099936 A | * | 5/2009 | G01R 1/07307 |
| JP | 2016-046285 | | 4/2016 | |
| JP | 2016046285 A | * | 4/2016 | G01R 31/2891 |
| JP | 2018067602 A | | 4/2018 | |
| JP | 2018067603 A | * | 4/2018 | |
| JP | 6471401 B1 | * | 2/2019 | |
| JP | 2020194889 A | * | 12/2020 | G01R 1/07342 |
| KR | 20120081023 A | * | 7/2012 | |
| KR | 20120104405 A | * | 9/2012 | |
| KR | 10-2013-0115575 | | 10/2013 | |
| KR | 20150054813 A | * | 5/2015 | |
| KR | 20170006127 A | * | 1/2017 | |
| KR | 20190016695 A | * | 2/2019 | |
| KR | 10-2019-0056091 | | 5/2019 | |
| KR | 20200106774 A | * | 9/2020 | |
| TW | I429014 B | * | 3/2014 | |
| TW | I761555 B | * | 4/2022 | |
| WO | WO-2014021176 A1 | * | 2/2014 | G01R 1/07307 |
| WO | 2015/098892 | | 7/2015 | |
| WO | WO-2019176238 A1 | * | 9/2019 | |
| WO | WO-2020241306 A1 | * | 12/2020 | G01R 1/07342 |

* cited by examiner

TRANSPORT SYSTEM, INSPECTION SYSTEM, AND INSPECTION METHOD

TECHNICAL FIELD

The present disclosure relates to a transport system, an inspection system, and an inspection method.

BACKGROUND ART

There is known an inspection apparatus for performing, while a shared transport robot or mobile stage is transporting a substrate to one of a plurality of inspection units arranged in an inspection chamber, inspection of another substrate by another inspection unit (see Patent Document 1, for example).

PRIOR ART DOCUMENT

Patent Document

[Patent Document 1] Japanese Laid-open Patent Publication No. 2016-046285

SUMMARY OF THE INVENTION

Problem to be Solved by the Invention

The present disclosure provides a technique that can enhance the operation rate of inspection units.

Means for Solving the Problem

According to one aspect of the present disclosure, a transport system includes a mobile cassette unit capable of storing a plurality of structures and supplying the structures to an inspection unit, wherein each of the structures includes a substrate on which a plurality of devices are formed, and an interconnect member including a contact section that electrically contacts an electrode of the plurality of devices.

Effects of the Invention

According to the present disclosure, the operation rate of inspection units can be enhanced.

DESCRIPTION OF THE EMBODIMENTS

In the following, a non-limiting embodiment of the present disclosure will be described with reference to the accompanying drawings. In all the accompanying drawings, the same or corresponding reference numerals shall be attached to the same or corresponding components and the duplicative description thereof will be omitted.

First Embodiment

An inspection system according to a first embodiment will be described. The inspection system is a system that provides electrical signals to a plurality of devices (DUTs) formed on an object to be inspected to inspect various electrical characteristics of the device. For example, the object to be inspected may be a substrate, such as a semiconductor wafer (hereinafter referred to as the "wafer").

Figure 1:
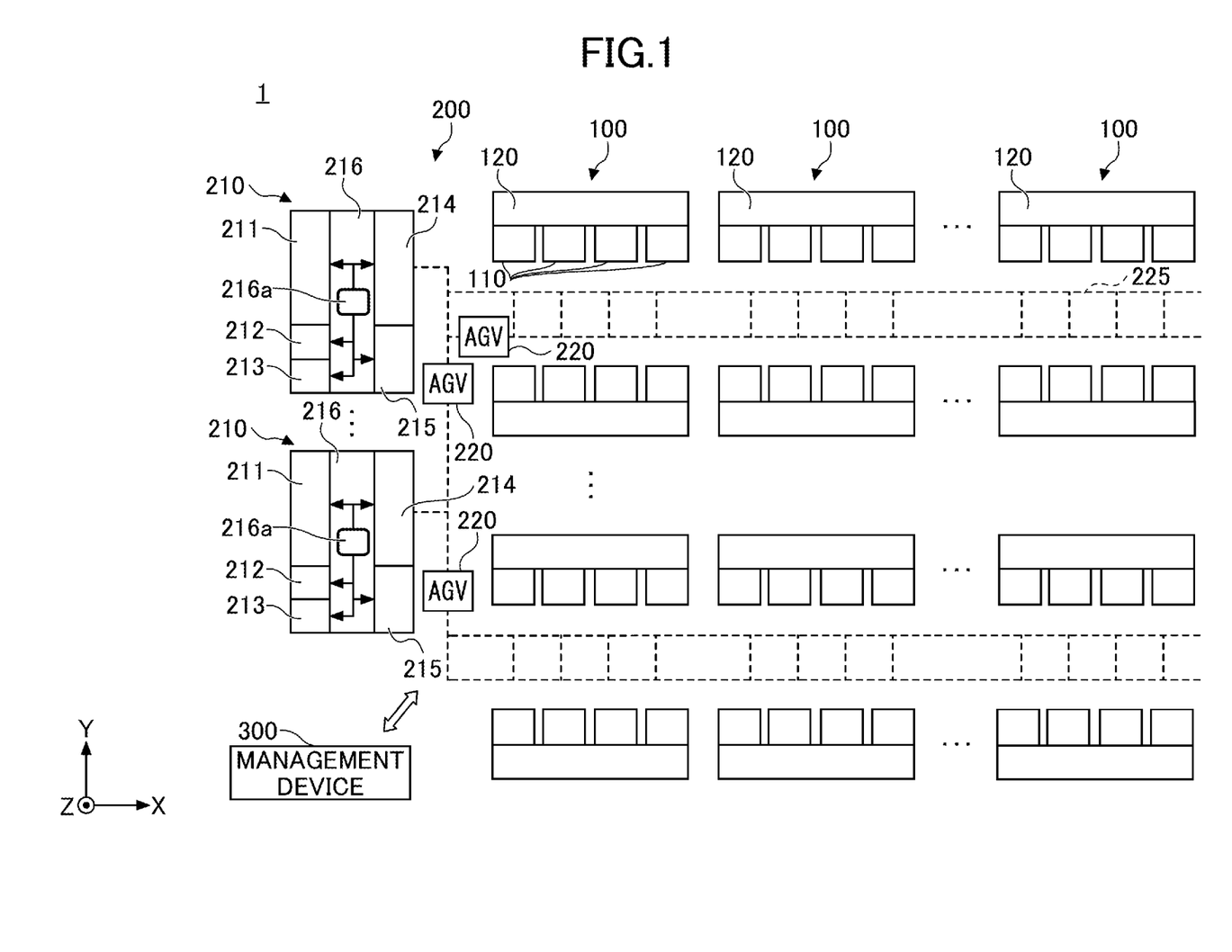
FIG. 1 is a diagram illustrating a configuration example of an inspection system according to a first embodiment.

FIG. 1 is a diagram illustrating an example of an inspection system according to the first embodiment. As illustrated in FIG. 1, the inspection system 1 includes multiple inspection units 100, a transport system 200, and a management device 300.

The multiple inspection units 100 are arranged side by side in a lateral direction (X direction in FIG. 1) and in a longitudinal direction (Y direction in FIG. 1) in the same plane. Each of the inspection units 100 includes multiple inspection devices 110 and a chiller 120.

Each of the inspection devices 110 receives a shell 10 that is transported by a cassette unit 220 to be described below, and inspects the electrical characteristics of each DUT formed on a wafer 11.

Figure 2:
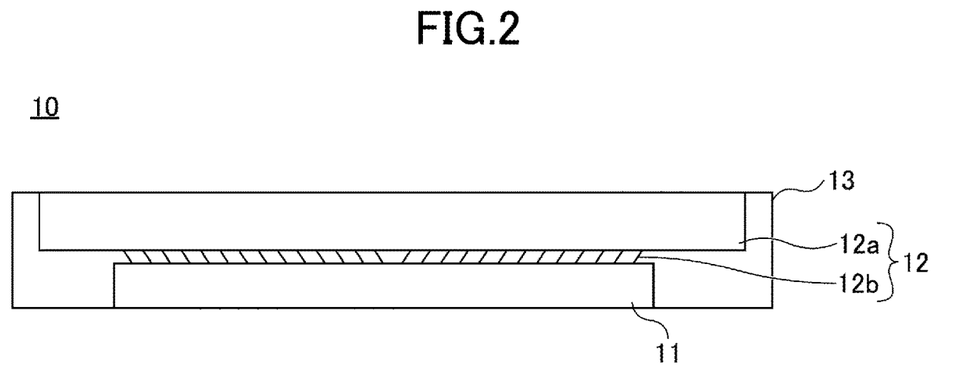
FIG. 2 is a diagram illustrating an example of a shell.

FIG. 2 is a diagram illustrating an example of the shell 10. As illustrated in FIG. 2, the shell 10 is a structure including the wafer 11, a probe card 12, a housing 13. However, the shell 10 does not have to have the housing 13. A plurality of DUTs are formed on the surface of the wafer 11. The probe card 12 is an example of an interconnect member, and includes a base 12a and multiple probes 12b. The base 12a is a plate-like member having multiple terminals (not illustrated) on the upper surface. The multiple probes 12b are an example of a contact section, and are provided on the lower surface of the base 12a to be able to contact the electrodes of the DUTs formed on the wafer 11. The housing 13 accommodates the wafer 11 and the probe card 12.

Figure 3:
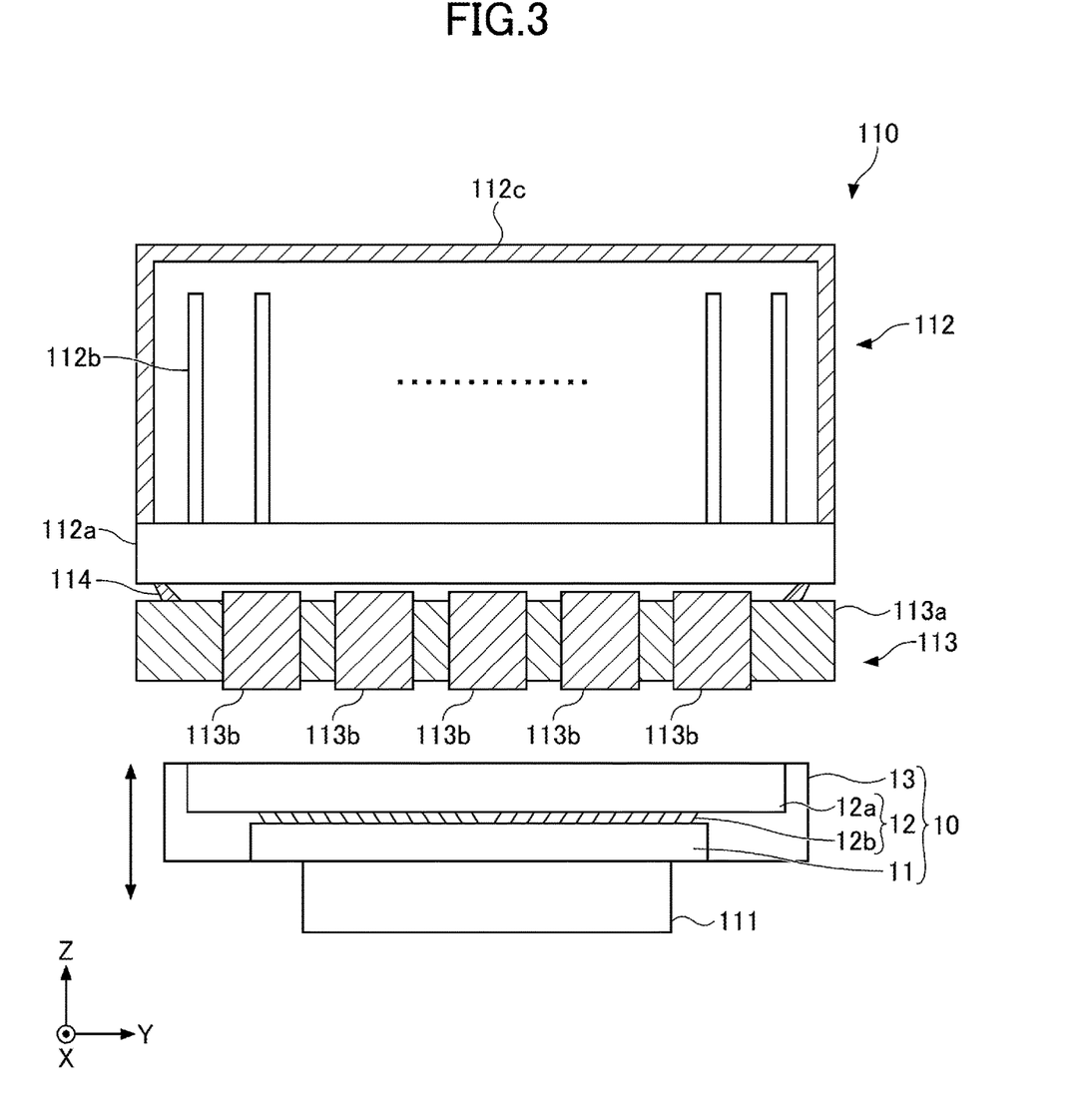
FIG. 3 is a diagram illustrating an example of a tester.

FIG. 3 is a diagram illustrating an example of a tester. As illustrated in FIG. 3, each inspection device 110 includes a stage 111, a tester 112, and an intermediate connection member 113.

A shell 10 transported by the cassette unit 220 is placed on the stage 111. The stage 111 is configured to be liftable and lowerable by a lifting and lowering mechanism (not illustrated) between a position for transferring the shell 10 to and from the cassette unit 220 (position indicated by FIG. 3) and a position at which the shell 10 is inspected with the shell 10 contacted to the intermediate connection member 113. The stage 111 is provided with a wafer holder (not illustrated) such as a vacuum chuck or an electrostatic chuck, and is configured so that the shell 10 can be adsorbed while the shell 10 is placed on the upper surface of the stage 111. Also, the stage 111 is provided with a temperature adjuster (not illustrated) such as a heater and a heat medium flow path and is configured so that the temperature of the wafer 11 can be adjusted with the shell 10 placed on the upper surface of the stage 111.

The tester 112 includes a tester motherboard 112a, multiple inspection circuit boards 112b, and a housing 112c. The tester motherboard 112a is provided horizontally and includes multiple terminals (not illustrated) at the bottom. The multiple inspection circuit boards 112b are attached to respective slots in the tester motherboard 112a in an upright position. The housing 112c accommodates the inspection circuit boards 112b.

The intermediate connection member 113 is a member for electrically connecting the tester 112 with the probe card 12, and includes a pogo frame 113a and pogo blocks 113b.

The pogo frame 113a is formed of a material of high strength, high stiffness, and a low thermal expansion coefficient, such as a NiFe alloy. The pogo frame 113a includes multiple rectangular fitting holes extending in a thickness direction (Z direction), and the pogo blocks 113b are fitted into the fitting holes.

The pogo blocks 113b are positioned to the pogo frame 113a and connect terminals of the tester motherboard 112a of the tester 112 with terminals of the base 12a of the probe card 12.

A sealing member 114 is provided between the tester motherboard 112a and the pogo frame 113a. By evacuating the space between the tester motherboard 112a and the intermediate connection member 113, the tester motherboard 112a is attracted by suction to the intermediate connection member 113 via the sealing member 114. Between the pogo frame 113a and the probe card 12, a sealing member (not illustrated) is also provided. By evacuating the space between the intermediate connection member 113 and the probe card 12, the probe card 12 is attracted by suction to the intermediate connection member 113 via the sealing member.

According to the inspection device 110 described above, first, the shell 10 is positioned by a positioning pin (not illustrated) in a state of being attracted to the stage 111 of each inspection device 110. Thus, multiple terminals on the upper surface of the probe card 12 are electrically connected to multiple terminals on the bottom of the tester mother board 112a via the intermediate connection member 113. Then, the inspection of the electrical characteristics of the DUTs formed on the wafer 11 is performed by the tester 112 via the probe card 12.

The chiller 120 cools stages 111 in the inspection devices 110 by supplying a refrigerant, such as cooling water, to a refrigerant passage provided in the stages 111. In the example of FIG. 1, one chiller 120 is provided for four inspection devices 110. However, a separate chiller 120 may be provided for each inspection device 110.

The transport system 200 includes multiple loader units 210 and multiple cassette units 220.

The multiple loader units 210 are arranged in the front-rear direction (Y direction in FIG. 1) in the same plane. Each of the loader units 210 includes a FOUP stocker 211, a probe card stocker 212, a needle polishing section 213, a shell stocker 214, an attaching and detaching section 215, and a transport section 216.

The FOUP stocker 211 is an area for storing vessels for transfer (front opening unified pod [FOUP]) that accommodate multiple wafers 11. The FOUP stocker 211 is provided with, for example, multiple storage shelves for storing FOUPs. FOUPs are transported into the FOUP stocker 211 from outside of the inspection system 1. The FOUP stocker 211 is accessible by a transport device 216a in a transport section 216, which will be described below.

A probe card stocker 212 is an area for storing multiple probe cards 12. The probe card stocker 212 includes, for example, multiple storage shelves for storing probe cards 12. Probe cards 12 are transported into the probe card stocker 212 from outside of the inspection system 1. The probe card stocker 212 is accessible by the transport device 216a in the transport section 216, which will be described below.

The needle polishing section 213 is an area in which the tip of probes 12b of the probe card 12 is polished, to repair the probes 12b to which dust or the like is attached. The needle polishing section 213 is provided with a needle polishing board for polishing the tip of the probe 12b, for example. The needle polishing section 213 is accessible by the transport device 216a in the transport section 216, which will be described later below.

The shell stocker 214 is an area for storing multiple shells 10. The shell stocker 214 includes, for example, multiple storage shelves for storing shells 10. The shell stocker 214 stores shells 10 having been formed in the attaching and detaching section 215 and shells 10 having been inspected by the inspection unit 100. The shell stocker 214 is accessible by the transport device 216a in the transport section 216 and the cassette unit 220, which will be described below.

The attaching and detaching section 215 is an area for forming the shell 10 into which the wafer 11 and the probe card 12 are integrated, and is also an area for separating the shell 10 into the wafer 11 and the probe card 12. In the attaching and detaching section 215, the wafer 11 is aligned by an aligner (not illustrated) with the wafer 11 attracted and held, and the probes 12b of the probe card 12 are contacted and connected to respective electrodes of the DUTs and then it is housed in the housing 13. Further, in the attaching and detaching section 215, a set of the wafer 11 and the probe card 12 integrated as the shell 10 is separated. The attaching and detaching section 215 is accessible by the transport device 216a in the transport section 216, which will be described below.

The transport section 216 is an area that transports the shell 10, the wafer 11, and the probe card between the areas. The transport section 216 is provided with the transport device 216a. The transport device 216a holds the shell 10, the wafer 11 and the probe card 12, and transports them between the areas. For example, the transport device 216a transports the shell 10 between the attaching and detaching section 215 and the shell stocker 214. Also, the transport device 216a transports the wafer 11 between the FOUP stocker 211 and the attaching and detaching section 215. Also, the transport device 216a transports the probe card 12 between the probe card stocker 212, the needle polishing section 213, and the attaching and detaching section 215.

Each of the multiple cassette units 220 is a mobile unit that stores multiple shells 10 and supplies the shells 10 to multiple inspection units 100. In the example of FIG. 1, each of the cassette units 220 is an AGV (Automated Guided Vehicle). For example, the cassette unit 220 runs automatically along a guide line 225, such as a magnetic tape laid on a floor.

Figure 4:
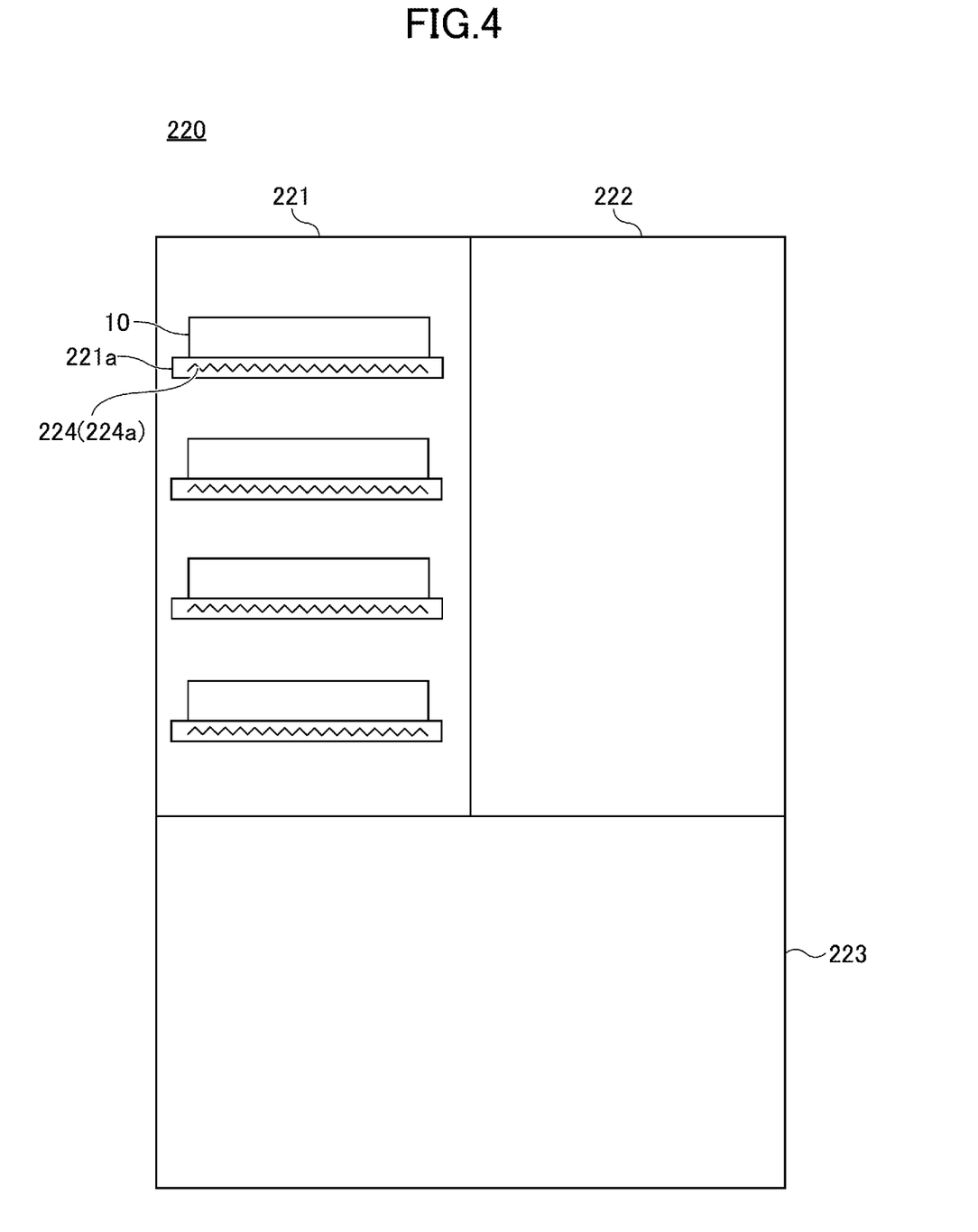
FIG. 4 is a diagram illustrating an example of a cassette unit.

FIG. 4 is a diagram illustrating an example of a cassette unit 220. As illustrated in FIG. 4, the cassette unit 220 includes a storage section 221, a transfer section 222, a drive section 223, and a temperature control section 224.

The storage section 221 stores multiple shells 10. The storage section 221 includes, for example, multiple mounting tables 221a, and places the shells 10 on the respective mounting tables 221a.

The transfer section 222 transfers the shell 10 between the storage section 221 and the multiple inspection units 100. The transfer section 222 includes a transfer robot (not illustrated) such as an articulated robot. At a position for transferring the shells 10 between the storage section 221 and the shell stocker 214, the transfer robot holds and transfers a shell 10 from the storage section 221 or the shell stocker 214 to the other. Also, at a position for transferring the shells 10 between the storage section 221 and the inspection unit 100, the transfer robot holds and transfers a shell 10 from the storage section 221 or the inspection unit 100 to the other.

The drive section 223 drives the cassette unit 220. The drive section 223 includes, for example, drive wheels, motors for driving the wheels and the transfer robot, and a battery that drives the motors. Also, the drive section 223 may include a power receiver to be able to receive electric power by wireless power supply or power supply via a rail, for example.

The temperature control section 224 adjusts the temperature of the shell 10 stored in the storage section 221. The temperature control section 224 may be a mechanism that adjusts the temperature of only a partial area of the storage section 221, such as only the shell 10, or may be a constant temperature bath that adjusts the overall temperature within the storage section 221. In the example of FIG. 4, the temperature control section 224 includes a heater 224a embedded in a mounting table 221a provided in the storage section 221, for example. It should be noted that the temperature control section 224 may include a heating device other than the heater 224a embedded in the mounting table 221a and may include a heat medium flow passage formed in the mounting table 221a and a chiller or the like for circulating the heat medium in the heat medium flow passage.

The management device 300 controls operations of the multiple cassette units 220, based on position information of the multiple cassette units 220 measured by a position measuring device. For example, the management device 300 determines which cassette unit 220 should be directed to the inspection device 110, based on the position information of the multiple cassette units 220 as measured by the position measuring device. For example, the management device 300 may determine that the cassette unit 220 positioned closest to an inspection device 110 of interest should be directed to the inspection device 110. The management device 300 may also calculate an optimum route for the determined cassette unit 220 to transport the shell 10, and may operate the cassette unit 220 with the calculated optimum route. The management device 300 may acquire the number of shells 10 stored in the storage section 221 of each of the cassette units 220, and control operations of the multiple cassette units 220 based on the acquired number of the shells 10. As an example, the management device 300 may preferentially operate a cassette unit 220 having a large number of acquired shells 10.

The position measuring device is not limited to any particular type of position measuring device, so long as it can measure and acquire position information of each of the multiple cassette units 220. An example of a position measuring device includes a plurality of position detecting sensors, each of which is disposed on the guide line 225 and is capable of detecting passage of the cassette unit 220. Alternatively, the position measuring device may be, for example, GNSS receivers, which are installed in the respective cassette units 220 to measure and acquire position information of the cassette units 220, by receiving a position measuring signal from a GNSS (Global Navigation Satellite System) satellite such as a GPS satellite.

As described above, the first embodiment includes a plurality of inspection units 100 and a mobile cassette unit 220 capable of storing a plurality of shells and supplying the shells 10 to the plurality of inspection units 100. This allows shells 10 to be transported to the plurality of inspection units 100 simultaneously, and therefore it is possible to reduce the time required to transport the shells 10 (wafers) to the inspection units 100. As a result, the wait time of the inspection units 100 can be reduced, and the operation rate of the inspection units 100 can be enhanced.

In the first embodiment, the cassette unit 220 includes the storage section 221 for storing the shells 10, and a temperature control section 224 that adjusts the temperature of the shell 10 stored in the storage section 221. This enables the temperature control section 224 to adjust the temperature of the wafer while the shell 10 is being transported by the cassette unit 220, in a case in which the inspection unit 100 performs inspection at a temperature different from room temperature. Thus, the time required to adjust the temperature of the wafers in the inspection units 100 can be reduced. As a result, the time from when the shell 10 is transported to the inspection unit 100 to when the inspection of the wafer is started can be shortened.

Also, in the first embodiment, a plurality of cassette units 220 that transport the shells 10 between the loader units 210 and the inspection units 100 are provided. Accordingly, even in a case where one cassette unit 220 fails, another cassette unit 220 can compensate for the failure. Therefore, it is not necessary to stop inspection units 100 due to a failure of a cassette unit 220.

Also, in the first embodiment, in a state in which the probes 12b of the probe card 12 are caused to electrically contact electrodes of the plurality of DUTs formed on the wafer 11, the wafer 11 and the probe card 12 are transported together to the inspection unit 100 by the cassette unit 220. This eliminates the positional adjustment between the wafer 11 and the probe card 12 in the inspection unit 100. Thus, because there is no need to provide an aligner for each inspection unit 100, the structure of the inspection unit 100 is simple. It should be noted that although positional adjustment between the probe card 12 and the tester 112 is performed in the inspection unit 100, because the interval between the electrodes is much larger than the interval between the probes 12b, this positional adjustment does not require high accuracy relative to positional adjustment between the wafer 11 and the probe card 12. Thus, positional adjustment can be performed using, for example, positioning pins. As an example of the required specifications for positional adjustment accuracy, the positional adjustment between the wafer 11 and the probe card 12 is in the order of μm, whereas the positional adjustment between the probe card 12 and the tester 112 is in the order of mm.

Next, an example of an inspection method using the inspection system according to the first embodiment will be described with reference to FIG. 1 to FIG. 4.

First, the wafer 11 in the FOUP stored in the FOUP stocker 211 is transported to the attaching and detaching section 215 by the transport device 216a. Also, the probe card 12 stored in the probe card stocker 212 is transported to the attaching and detaching section 215 by the transfer device 216a.

Subsequently, at the attaching and detaching section 215, the shell 10 in which the wafer 11 and the probe card 12 are assembled is formed by causing electrodes of a plurality of DUTs formed on the wafer 11 and the probes 12b of the probe card 12, provided corresponding to the electrodes, to be in contact with each other.

Subsequently, the shell 10 formed by the attaching and detaching section 215 is transported to the shell stocker 214 by the transport device 216a.

Subsequently, the shell 10 stored in the shell stocker 214 is received by the transfer section 222 of the cassette unit 220, and is mounted on the mounting table 221a of the storage section 221. Also, the mounting table 221a is heated by the heater 224a so that the temperature of the shell 10 is substantially the same as the inspection temperature in the inspection unit 100.

Subsequently, the cassette unit 220 supplies the shell 10 mounted on the mounting table 221a to a predetermined inspection unit 100. Specifically, after the cassette unit 220 moves in front of the predetermined inspection unit 100, the shell 10 mounted on the mounting table 221a is supplied to the inspection device 110 of the inspection unit 100 by the transfer section 222 of the cassette unit 220.

Subsequently, the inspection device 110 inspects the plurality of DUTs formed on the wafer 11 contained in the shell 10.

Subsequently, the cassette unit 220 transports, to the shell stocker 214, the shell 10 for which the inspection has been completed by the inspection device 110 of the inspection unit 100.

Subsequently, the shell 10 stored in the shell stocker 214 is transported to the attaching and detaching section 215 by the transport device 216a.

Subsequently, the shell 10 is separated into the wafer 11 and the probe card 12 at the attaching and detaching section 215.

Subsequently, the transport device 216a transports the wafer 11 and the probe card 12, separated by the attaching and detaching section 215, respectively into the FOUP and stored in the FOUP stocker 211 and the probe card stocker 212.

As described above, the inspection of the electrical characteristics of the plurality of DUTs formed on one wafer 11 is completed.

Second Embodiment

An inspection system according to a second embodiment will be described.

Figure 5:
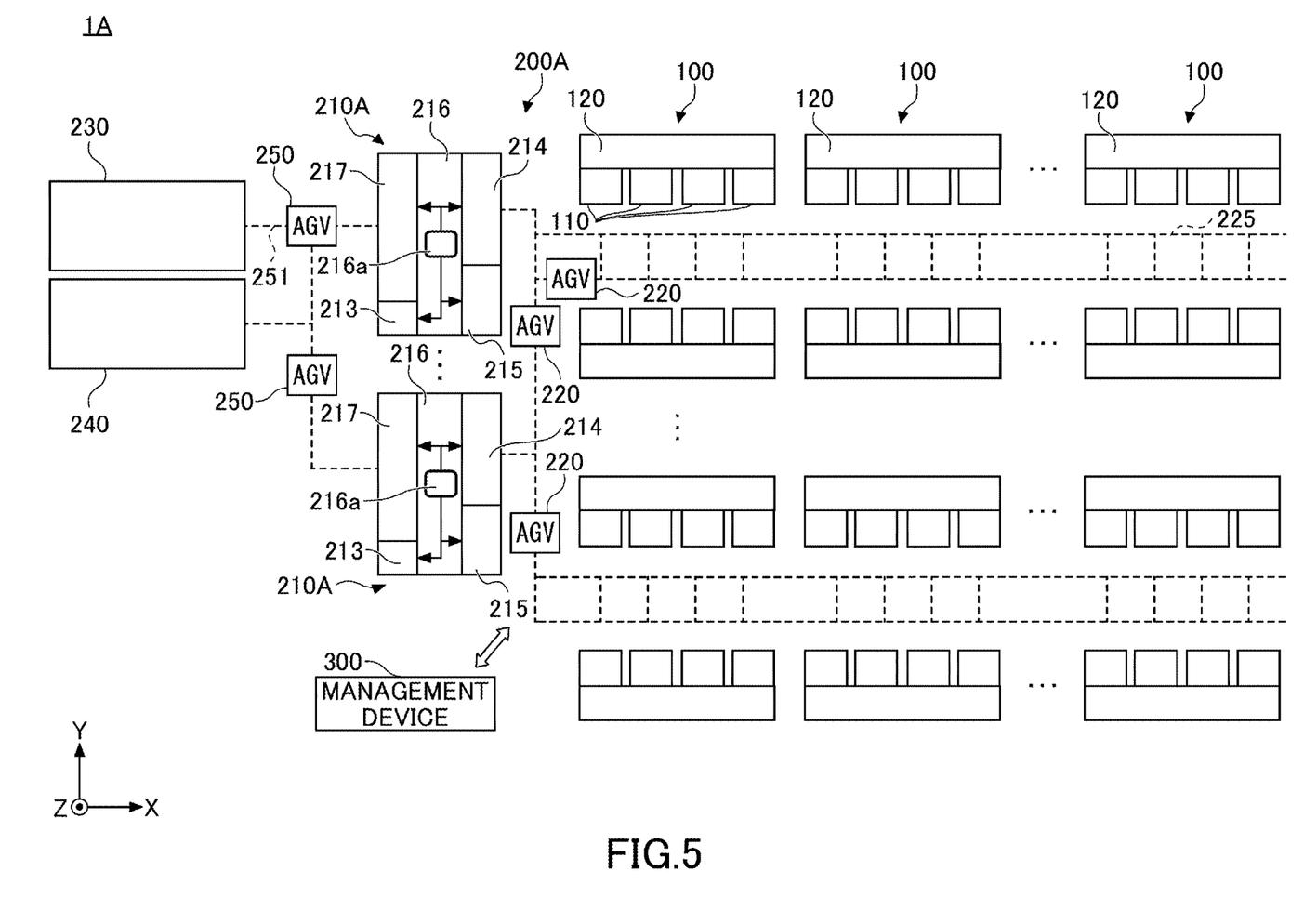
FIG. 5 is a diagram illustrating a configuration example of an inspection system according to a second embodiment.

FIG. 5 is a diagram illustrating an example of the inspection system according to the second embodiment. As illustrated in FIG. 5, the inspection system 1A of the second embodiment differs from the inspection system 1 of the first embodiment in that the inspection system 1A includes a loader unit 210A including a load port 217 instead of a FOUP stocker 211 and a probe card stocker 212. Since the other points are similar to the inspection system 1 according to the first embodiment, different points will be mainly described below.

The inspection system 1A includes a plurality of inspection units 100, a transport system 200A, and a management device 300.

The transport system 200A includes a plurality of loader units 210A, a plurality of cassette units 220, a FOUP stocker 230, a probe card stocker 240, and a transport unit 250.

The multiple loader units 210A are arranged in the front-rear direction (Y direction in FIG. 5) in the same plane. Each of the loader units 210A includes a needle polishing section 213, a shell stocker 214, an attaching and detaching section 215, a transport section 216, and a load port 217.

The needle polishing section 213, the shell stocker 214, the attaching and detaching section 215, and the transport section 216 are similar to the first embodiment.

The load port 217 is an area that receives a FOUP accommodating a plurality of wafers 11 and a probe card 12. The load port 217 is accessible by the transport unit 250, which will be described later. To the load port 217, the FOUP and the probe card 12 are transported by the transport unit 250 from the FOUP stocker 230 provided outside the loader unit 210A and the probe card stocker 240.

The FOUP stocker 230 stores FOUPs that accommodates a plurality of wafers 11. The FOUP stocker 230 is provided with a plurality of storage shelves for storing FOUPs, for example. The FOUP stocker 230 is accessible by the transport unit 250, which will be described later.

The probe card stocker 240 stores a plurality of probe cards 12. The probe card stocker 240 is provided with a plurality of storage shelves for storing the probe cards 12, for example. The probe card stocker 240 is accessible by the transport unit 250, which will be described later.

The transport unit 250 is a mobile unit that supplies a FOUP and a probe card 12 to the loader unit 210A. In the example of FIG. 1, the transport unit 250 is an AGV. For example, the transport unit 250 runs automatically along a guide line 225, such as a magnetic tape laid on a floor.

As described above, the second embodiment includes a plurality of inspection units 100 and a mobile cassette unit 220 capable of storing a plurality of shells and supplying the shells 10 to the plurality of inspection units 100. This allows shells 10 to be transported to the plurality of inspection units 100 simultaneously, and therefore it is possible to reduce the time required to transport the shells 10 (wafers) to the inspection units 100. As a result, the wait time of the inspection units 100 can be reduced, and the operation rate of the inspection units 100 can be enhanced.

In the second embodiment, the cassette unit 220 includes the storage section 221 for storing the shells 10, and a temperature control section 224 that adjusts the temperature of the shell 10 stored in the storage section 221. This enables the temperature control section 224 to adjust the temperature of the wafer while the shell 10 is being transported by the cassette unit 220, in a case in which the inspection unit 100 performs inspection at a temperature different from room temperature. Thus, the time required to adjust the temperature of the wafers in the inspection units 100 can be reduced. As a result, the time from when the shell 10 is transported to the inspection unit 100 to when the inspection of the wafer is started can be shortened.

Also, in the second embodiment, a plurality of cassette units 220 that transport the shells 10 between the loader units 210A and the inspection units 100 are provided. Accordingly, even in a case where one cassette unit 220 fails, another cassette unit 220 can compensate for the failure. Therefore, it is not necessary to stop inspection units 100 due to a failure of a cassette unit 220.

Also, in the second embodiment, in a state in which the probes 12b of the probe card 12 are caused to electrically contact electrodes of the plurality of DUTs formed on the wafer 11, the wafer 11 and the probe card 12 are transported together to the inspection unit 100 by the cassette unit 220. This eliminates the positional adjustment between the wafer 11 and the probe card 12 in the inspection unit 100. Thus, because there is no need to provide an aligner for each inspection unit 100, the structure of the inspection unit 100 is simple. It should be noted that although positional adjustment between the probe card 12 and the tester 112 is performed in the inspection unit 100, because the interval between the electrodes is much larger than the interval between the probes 12b, this positional adjustment does not require high accuracy relative to positional adjustment between the wafer 11 and the probe card 12. Thus, positional adjustment can be performed using, for example, positioning pins. As an example of the required specifications for positional adjustment accuracy, the positional adjustment between the wafer 11 and the probe card 12 is in the order of μm, whereas the positional adjustment between the probe card 12 and the tester 112 is in the order of mm.

The embodiments described herein should be considered to be exemplary in all respects and not limiting. The above embodiments may be omitted, substituted, or modified in various forms without departing from the appended claims and spirit thereof.

The present international application is based upon and claims priority to Japanese Patent Application No. 2019-

099727, filed on May 28, 2019, the entire contents of the Japanese Patent Application are hereby incorporated herein by reference.

DESCRIPTION OF THE REFERENCE NUMERALS 1, 1A inspection system
10 shell
11 wafer
12 probe card
100 inspection unit
200 transport system
220 cassette unit
221 storage section
221a mounting table
222 transfer section
223 drive section
224 temperature control section
300 management device

What is claimed is:

1. A transport system comprising:
a plurality of mobile cassette units capable of storing a plurality of structures and transferring the plurality of structures to a plurality of inspection units,
a management device configured to determine a destination for each of the plurality of mobile cassette units and cause the plurality of mobile cassette units to move to each determined destination, each determined destination being a place where one of the plurality of inspection units is located, and
a position measuring device configured to measure, for each of the plurality of mobile cassette units, a relative position of each of the plurality of mobile cassette units to each of the plurality of inspection units,
wherein the management device is configured to determine the destination based on the measured relative position,
wherein each of the plurality of structures includes
a substrate on which a plurality of devices are formed, and
an interconnect member including a contact section that electrically contacts an electrode of the plurality of devices.

2. The transport system according to claim 1, wherein each of the mobile cassette units is an automated guided vehicle.

3. The transport system according to claim 1, wherein the interconnect member is a probe card including a probe that contacts the electrode of the plurality devices.

4. The transport system according to claim 1, wherein each of the plurality of mobile cassette units includes
a storage section configured to store the structure,
a transfer section configured to transfer the structure between the storage section and the inspection unit, and
a drive section configured to drive the mobile cassette unit.

5. The transport system according to claim 4, wherein each of the plurality of mobile cassette unit includes a temperature control section configured to adjust a temperature of the structure stored in the storage section.

6. An inspection system comprising:
a plurality of inspection units; and
a plurality of mobile cassette units capable of storing a plurality of structures and transferring the plurality of structures to the plurality of inspection units,
a management device configured to determine a destination for each of the plurality of mobile cassette units and cause the plurality of mobile cassette units to move to each determined destination, each determined destination being a place where one of the plurality of inspection units is located, and
a position measuring device configured to measure, for each of the plurality of mobile cassette units, a relative position of each of the plurality of mobile cassette units to each of the plurality of inspection units,
wherein the management device is configured to determine the destination based on the measured relative position,
wherein each of the plurality of structures includes
a substrate on which a plurality of devices are formed, and
an interconnect member including a contact section that electrically contacts an electrode of the plurality of devices.

7. An inspection method comprising:
measuring, for each of a plurality of mobile cassette units, a relative position of each of the plurality of mobile cassette units to each of a plurality of inspection units,
determining a destination for each of the plurality of mobile cassette units based on the measured relative position, each determined destination being a place where one of the plurality of inspection units is located,
moving the plurality of mobile cassette units to the each determined destination,
transferring a plurality of structures stored in the plurality of mobile cassette units to the plurality of inspection units, and
inspecting a plurality of devices within the plurality of structures using the plurality of inspection units,
wherein the plurality of structures is stored in the plurality of mobile cassette units by following steps:
a step of causing an electrode of the plurality of devices formed on a substrate and a contact section of an interconnect member provided corresponding to the electrode to contact to form a structure in which the substrate and the interconnect member are assembled, and
a step of storing the structure in each of the plurality of mobile cassette units.

\* \* \* \* \*